(12) United States Patent
Loubiere et al.

(10) Patent No.: US 10,676,214 B2
(45) Date of Patent: Jun. 9, 2020

(54) METHOD FOR MAKING AN ELECTROLUMINESCENT MARKING ON AN EXTERIOR WALL OF AN AIRCRAFT, MARKING TAPE COMPRISING THE ELECTROLUMINESCENT MARKING, AND AIRCRAFT COMPRISING THE ELECTROLUMINESCENT MARKING

(71) Applicants: AIRBUS OPERATIONS (S.A.S.), Toulouse (FR); AIRBUS (S.A.S.), Blagnac (FR)

(72) Inventors: Vincent Loubiere, Toulouse (FR); Alix Courtadon, Toulouse (FR); Matthew Tringham, Toulouse (FR)

(73) Assignees: Airbus Operations (S.A.S.), Toulouse (FR); Airbus (S.A.S.), Blagnac (FR)

( * ) Notice: Subject to any disclaimer, the term of this patent is extended or adjusted under 35 U.S.C. 154(b) by 287 days.

(21) Appl. No.: 15/637,818

(22) Filed: Jun. 29, 2017

(65) Prior Publication Data
US 2018/0002033 A1  Jan. 4, 2018

(30) Foreign Application Priority Data

Jun. 29, 2016 (FR) .................................... 16 56112

(51) Int. Cl.
*B64D 47/00* (2006.01)
*H05B 33/10* (2006.01)
(Continued)

(52) U.S. Cl.
CPC .......... *B64D 47/00* (2013.01); *B32B 37/1284* (2013.01); *B32B 37/144* (2013.01);
(Continued)

(58) Field of Classification Search
CPC .... G09F 21/10; G09F 13/22; G09F 2013/227; H01L 2251/5338; H01L 51/0097;
(Continued)

(56) References Cited

U.S. PATENT DOCUMENTS

| 8,470,388 B1 | 6/2013 | Zsinko et al. |
| 2003/0134488 A1 | 7/2003 | Yamazaki et al. |

(Continued)

FOREIGN PATENT DOCUMENTS

| FR | 3002206 A1 | 8/2014 |
| TW | 200843345 A | 11/2008 |

(Continued)

OTHER PUBLICATIONS

French Search Report for Application No. 1656112 dated Feb. 17, 2017.

(Continued)

*Primary Examiner* — Vishal I Patel
(74) *Attorney, Agent, or Firm* — Jenkins, Wilson, Taylor & Hunt, P.A.

(57) ABSTRACT

A method for making an electroluminescent marking on an exterior wall of an aircraft, including a step of superpositioning of layers designed or configured to produce the electroluminescent marking on a first face of a flexible backing distinct from the aircraft to obtain a marking tape and a step of affixing the marking tape to the exterior wall of the aircraft. The disclosure herein also concerns a marking tape for the implementing of the method, a marking device obtained from the method, and an aircraft comprising the marking device.

15 Claims, 2 Drawing Sheets

(51) Int. Cl.
*H01L 27/32* (2006.01)
*H01L 51/00* (2006.01)
*H01L 51/52* (2006.01)
*B32B 37/18* (2006.01)
*G09F 21/10* (2006.01)
*B32B 37/14* (2006.01)
*B32B 37/12* (2006.01)
*B60Q 1/26* (2006.01)
*B60Q 1/00* (2006.01)
*B64C 1/00* (2006.01)
*H05B 33/06* (2006.01)
*H05B 33/28* (2006.01)
*B32B 37/26* (2006.01)
*F21V 21/08* (2006.01)
*G09F 13/22* (2006.01)

(52) U.S. Cl.
CPC ............ *B32B 37/18* (2013.01); *B60Q 1/0088* (2013.01); *B60Q 1/2615* (2013.01); *B64C 1/0009* (2013.01); *G09F 21/10* (2013.01); *H01L 27/3239* (2013.01); *H01L 51/0097* (2013.01); *H01L 51/5237* (2013.01); *H05B 33/06* (2013.01); *H05B 33/10* (2013.01); *H05B 33/28* (2013.01); *B32B 2037/268* (2013.01); *B32B 2307/422* (2013.01); *B32B 2605/18* (2013.01); *B60Q 2400/10* (2013.01); *F21V 21/0808* (2013.01); *G09F 13/22* (2013.01); *G09F 2013/227* (2013.01); *H01L 2251/5338* (2013.01); *Y02E 10/549* (2013.01)

(58) Field of Classification Search
CPC ............. H01L 51/5237; H01L 27/3239; B32B 37/144; B32B 37/18; B32B 2307/422; B32B 2605/18; B32B 2037/268; B32B 37/1284; Y02E 10/549; B64C 1/0009; B64D 47/00; H05B 33/06; H05B 33/28; H05B 33/10; F21V 21/0808; B60Q 2400/10; B60Q 1/0088; B60Q 1/2615
See application file for complete search history.

(56) References Cited

U.S. PATENT DOCUMENTS

| 2008/0142238 | A1 | 6/2008 | Rawlings | |
| 2010/0157585 | A1* | 6/2010 | Diekmann | F21S 6/002 362/228 |
| 2011/0198015 | A1* | 8/2011 | Anderson | B60Q 1/30 156/67 |
| 2015/0083190 | A1 | 3/2015 | Conklin et al. | |
| 2016/0042675 | A1 | 2/2016 | Marchetti et al. | |

FOREIGN PATENT DOCUMENTS

| WO | WO-2008008167 A2 * | 1/2008 | ............ H05B 33/28 |
| WO | WO 2008/088333 A1 | 7/2008 | |

OTHER PUBLICATIONS

Chinese Office Action for Application No. 201710510876 dated Sep. 3, 2019.

* cited by examiner

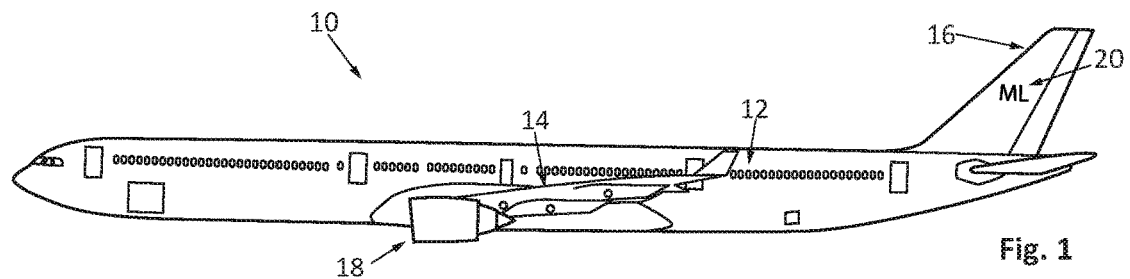
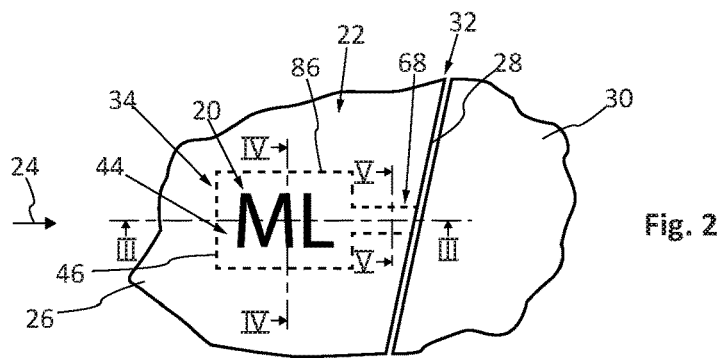
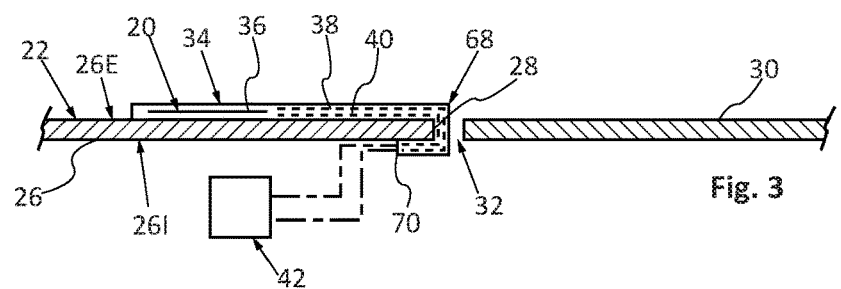
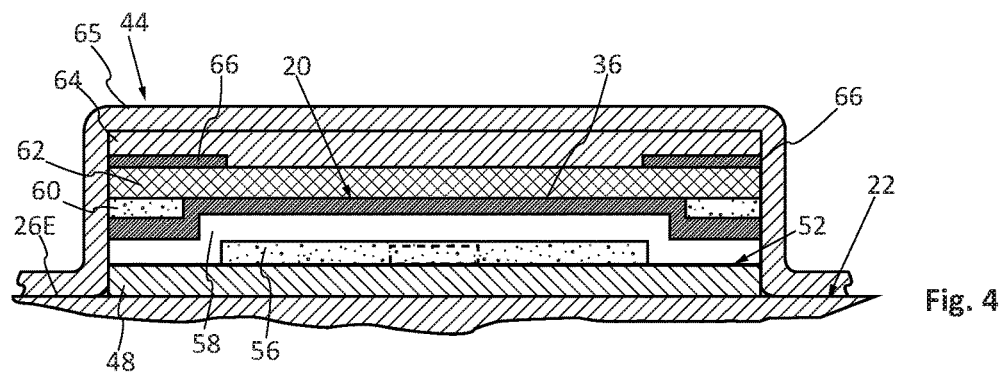
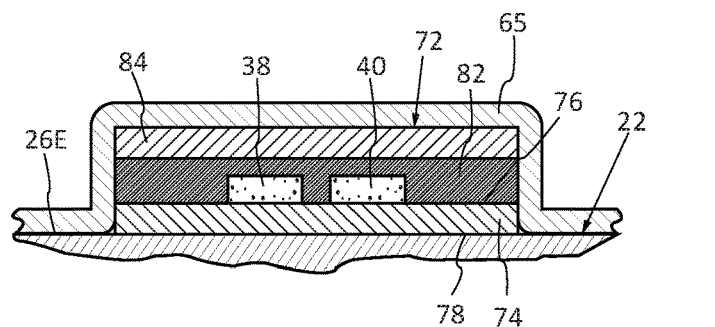

METHOD FOR MAKING AN ELECTROLUMINESCENT MARKING ON AN EXTERIOR WALL OF AN AIRCRAFT, MARKING TAPE COMPRISING THE ELECTROLUMINESCENT MARKING, AND AIRCRAFT COMPRISING THE ELECTROLUMINESCENT MARKING

CROSS-REFERENCE TO RELATED APPLICATIONS

This application claims priority to co-pending French Patent Application FR 16 56112, filed Jun. 29, 2016, the content of which is incorporated by reference herein in its entirety.

TECHNICAL FIELD

The present application relates to a method for making an electroluminescent marking on an exterior wall of an aircraft, a marking tape comprising the electroluminescent marking as well as an aircraft comprising the electroluminescent marking.

BACKGROUND

An exterior wall of an aircraft comprises at least one marking such as a registration number for example. According to one embodiment, this marking is electroluminescent to remain visible at night or when weather conditions are not favorable.

U.S. Pat. No. 8,470,388 proposes one solution for making an electroluminescent marking on a backing which may be an exterior wall of an aircraft. According to this document, the marking process involves a first step of depositing a first insulating layer on the exterior wall of the aircraft, a second step of depositing a second layer of conductive paint, a third step of depositing a third electroluminescent layer, a fourth step of putting in place a power supply electrode positioned on the perimeter of the electroluminescent layer, a fifth step of depositing a fourth transparent conductive layer and a sixth step of depositing a fifth protection layer such as a varnish.

These different steps are carried out one after another on the aircraft. Given the time it takes to make and dry these different layers, this marking process has a major impact on the production sequence of an aircraft.

In order to make the marking so affixed luminescent, the second layer of conductive paint and the power supply electrode are connected by a wire network to an electrical control and power supply system positioned inside the aircraft. For this purpose, the exterior wall of the aircraft comprises at least one orifice, generally two orifices, positioned around or near the electroluminescent marking to allow the passage of the wire network. When the marking is affixed to a surface subject to an air flow (such as a wall of the fuselage), the operation of piercing modifies the surface of the aircraft which is subjected to an air flow and degrades the aerodynamic performance of the aircraft. Likewise, the presence of a wire network on the surface of the aircraft disturbs the movement of the air flow and the performance of the aircraft.

The present disclosure proposes to remedy the drawbacks of the prior art.

SUMMARY

For this purpose, the disclosure herein concerns a method of making an electroluminescent marking on an exterior wall of an aircraft, the exterior wall comprising a panel with an exterior face and an interior face and being bounded by an edge.

According to the disclosure herein, the method involves a step of superpositioning of layers designed or configured to produce the electroluminescent marking on a first face of a flexible backing distinct from the aircraft to obtain a marking tape and a step of affixing the marking tape to the exterior wall of the aircraft.

Unlike the prior art, the electroluminescent marking is made on a flexible backing independent of the aircraft and not directly on the aircraft. Thus, the electroluminescent marking is affixed to the aircraft in a single step of limited duration.

Advantageously, the marking tape comprises a second adhesive face designed or configured to be pasted against the exterior wall and the method involves a step of depositing a protection film against the second adhesive face and a step of removal of the protection film prior to the step of affixing.

Preferably, the method involves a step of affixing at least one connection tape to the exterior face of the panel as far as the edge of the panel to connect the electroluminescent marking to an electrical control and power supply system positioned inside the aircraft.

The disclosure herein likewise concerns a marking device which comprises an electroluminescent marking and which comprises a flexible backing with a first face having a superpositioning of layers designed or configured to produce the electroluminescent marking and a second face designed or configured to be pasted against an exterior face of a panel of an exterior wall of an aircraft.

Advantageously, the second face is adhesive and the marking device comprises a protection film covering the second adhesive face.

Preferably, the marking device comprises an extension designed or configured to extend on the exterior face of the panel as far as one edge of the panel in order to connect the electroluminescent marking to an electrical control and power supply system positioned inside the aircraft.

The disclosure herein also concerns a marking device comprising at least one marking tape according to the disclosure herein.

According to another characteristic, the marking device comprises at least one connection tape for connecting the marking tape to an electrical control and power supply system positioned inside the aircraft, the connection tape being configured to extend on the exterior face of the panel from the marking tape to one edge of the panel.

According to another characteristic, the marking device comprises at least one first and one second connection tape, each of them comprising at least one electrical conductor and a junction tape straddling the first and second connection tapes so as to join the conductor elements of the first and second connection tapes.

Finally, the disclosure herein also concerns an aircraft having a marking device according to the disclosure herein.

BRIEF DESCRIPTION OF THE DRAWINGS

Other characteristics and advantages will emerge from the following description of the disclosure herein, which is given solely as an example, in regard to the appended, example drawings, in which:

FIG. 1 is a side view of an aircraft comprising an electroluminescent marking;

FIG. 2 is a front view of a panel of an aircraft comprising an electroluminescent marking illustrating one embodiment of the disclosure herein;

FIG. 3 is a cross-section along line III-Ill of the panel visible in FIG. 2;

FIG. 4 is a cross-section along line IV-IV of FIG. 2 of a marking tape comprising an electroluminescent marking affixed to a panel illustrating one embodiment of the disclosure herein;

FIG. 5 is a cross-section along line V-V of FIG. 2 of a connection tape affixed to a panel illustrating one embodiment of the disclosure herein;

DETAILED DESCRIPTION

Figure 6:
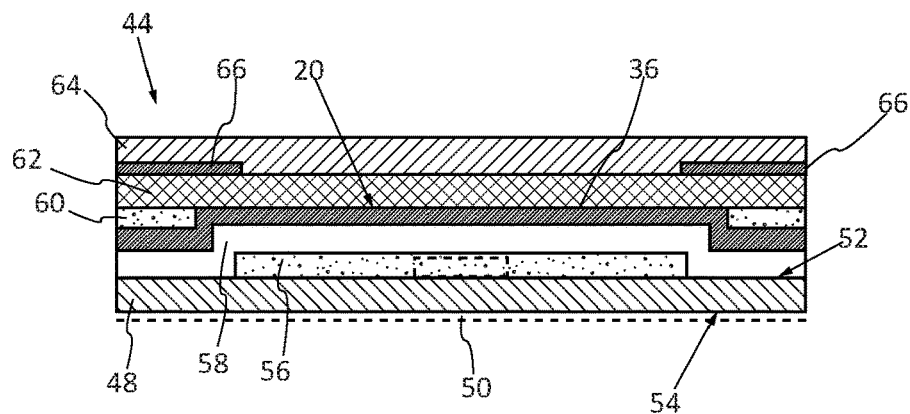
FIG. 6 is a cross-section of the marking tape visible in FIG. 4 prior to its affixing to a panel.

FIG. 1 represents an aircraft 10 comprising among other things a fuselage 12, an airfoil 14, an empennage 16, and nacelles 18.

According to one configuration visible in FIG. 1, the aircraft 10 comprises an electroluminescent marking 20 positioned on the empennage 16.

Of course, the disclosure herein is not limited to this position for the electroluminescent marking 20. Thus, as illustrated in FIGS. 1 and 2, the marking 20 is affixed to an exterior wall 22.

According to one embodiment, the electroluminescent marking 20 comprises at least one alphanumerical character. According to the example illustrated in FIGS. 1 and 2, the electroluminescent marking 20 comprises two letters "M" and "L". Of course, the disclosure herein is not limited to this type of marking, and the electroluminescent marking may be a decoration.

In the rest of the description, an exterior wall 22 is a wall of the aircraft in contact with an air flow 24 moving on the outside of the aircraft in flight. This air flow 22 is represented in the form of an arrow in FIG. 2 which indicates the direction of movement of the air flow 24.

As an example and without limitation, the exterior wall 22 may be part of the fuselage 12, of the airfoil 14, of the empennage 16 or of one of the nacelles 18 of the aircraft.

According to one embodiment visible in FIGS. 2 and 3, this exterior wall 22 comprises at least one panel 26 with one exterior face 26E and one interior face 26I. This panel 26 comprises at least one edge 28. According to one configuration, the exterior wall 22 comprises, besides the panel 26, at least one structural element 30 which adjoins the panel 26 in the area of the edge 28. Depending on the case, this structural element 30 may be another panel, a porthole frame, or something else. The panel 26 and the structural element 30 are separated by a gap 32.

According to one configuration, the edge 28 is disposed downstream from the electroluminescent marking 20 in the direction of movement of the air flow 24.

In order to produce the electroluminescent marking 20 on the exterior wall 22, a marking device 34 is affixed to the exterior face 26E of the panel 26.

This marking device 34 comprises at least one marking tape 44 comprising a flexible backing 48 with a first face 52 which bears at least one electroluminescent layer 36 joined by a first electrical conductor 38 and a second electrical conductor 40 to an electrical control and power supply system 42 positioned inside the aircraft 10. The number of electroluminescent layers 36 and their forms are determined as a function of the desired electroluminescent marking 20.

A second face 54 of the flexible backing 48 is designed or configured to be pasted against the exterior face 26E of the panel 26.

The electroluminescent marking 20 comprises a transparent protection layer 65 (visible in FIGS. 4 and 5) covering the marking device 34 and a portion of the exterior face 26E of the exterior panel 26.

According to one embodiment visible in FIG. 4, the marking tape 44 comprises, on the first face 52, a superpositioning of layers comprising, starting at the first face 52:

a first conductive layer 56;
a dielectric layer 58;
the electroluminescent layer 36;
at least one power supply electrode 60 positioned on at least one portion of the perimeter of the electroluminescent layer 36;
a second transparent conductive layer 62; and
at least one transparent protection layer 64.

As a variant, the tape 34 comprises at least one decoration layer 66 positioned on the perimeter of at least one of the electroluminescent layers 36 and which is inserted between the transparent protection layers 64, 65 or between the transparent conductive layer 62 and the transparent protection layer 64. The decoration layer 66 has determined forms to bring out the electroluminescent marking 20 and to camouflage the power supply electrodes 60.

According to another variant, a coupling layer may be provided between the flexible backing 48 and the first conductive layer 56.

As a variant, an intermediate layer able to improve the cohesion and the adherence between the other layers of the stack is inserted between the layers 56, 58, 36, 62 and 64 of the marking tape.

The conductive layer 56, the dielectric layer 58, the electroluminescent layer 36, the power supply electrode 60, the transparent conductive layer 62 and the transparent protection layer 64 are not further described, since they may be identical to those set forth in U.S. Pat. No. 8,470,388.

As an illustration, the first conductive layer 56, the dielectric layer 58 and the electroluminescent layer 36 each have a thickness between 0.02 and 0.05 mm, the second transparent conductive layer 62 has a thickness less than 0.015 mm and each transparent protection layer 64 has a thickness of the order of 0.05 mm.

According to the disclosure herein, the method of making an electroluminescent marking 20 on an exterior wall 22 of an aircraft comprises a first step of superpositioning of different layers 56, 58, 36, 62 and 64 configured to produce the desired electroluminescent marking 20 on a first face 52 of a flexible backing 48 distinct from the aircraft 10 to produce a marking tape 44 and a second step of affixing the marking tape 44 to the exterior wall 22. Thus, the different layers 56, 58, 36, 62 and 64, each configured to produce the desired electroluminescent marking 20, are affixed to the exterior wall 22 of the aircraft 10 in a single step and not successively as in the prior art, which tends to reduce the time of the operation on the aircraft to produce the electroluminescent marking 20.

Preferably, the second face 54 of the flexible backing 48 is adhesive. In this case, as illustrated in FIG. 6, the marking tape 44 comprises a protection film 50 configured to cover the second adhesive face 54 and to be removed in order to be able to apply the second face 54 against the exterior wall 22 of the aircraft. In this case, the method involves a step of depositing the protection film 50 against the second adhesive face 54 before or during the first step and a step of removal of the protection film 50 prior to the second step of affixing.

The fact of having a second adhesive face 54 makes it possible to simplify the second step of affixing of the marking tape 44 to the exterior wall 22 of the aircraft. The protection film 50 allows for protecting this second adhesive face 54 from the first step of fabrication of the marking tape 44 to the second step of affixing. Thus, the marking tape 44 may be stored and applied to the aircraft in a longer or shorter time after its fabrication.

According to another characteristic of the disclosure herein, the marking device 34 comprises an extension 68 in the form of a tape extending, on the exterior face 26E of the panel 26, from the marking tape 44 to the edge 28 of the panel, and on the interior face 261 of the panel 26, from the edge 28 to a point 70 offset in relation to the edge 28. Thus, the extension 68 is arranged straddling the interior 261 and exterior 26E faces of the panel 26 starting from the edge 28.

According to one configuration, the extension 68 is positioned downstream according to the direction of movement of the air flow 24 in relation to the marking tape 44.

As illustrated in FIG. 5, the extension 68 is present in the form of at least one connection tape 72 comprising a flexible backing 74 with a first face 76 bearing at least one electrical conductor 38, 40 and a second face 78 configured to be pasted against the exterior face 26E of the panel 26 and a portion of the interior face 261 of the panel 26.

According to one embodiment, the first face 76 bears the first electrical conductor 38 and the second electrical conductor 40.

The first electrical conductor 38 comprises a first end joined to the first conductive layer 56 and a second end joined to the electrical control and power supply system 42. The second electrical conductor 40 comprises a first end joined to the power supply electrode 60 and/or to the second transparent conductive layer 64 and a second end joined to the electrical control and power supply system 42.

According to the disclosure herein, the extension 68 allows joining of the electroluminescent marking 20 to an electrical power supply system 42 of the aircraft by passing through a gap 32 provided between the panel 26 and an adjacent structural element 30. Advantageously, the electrical power supply system 42 is situated in a zone of the aircraft not subjected to the air flow 22 when the aircraft is moving. Thus, it is not necessary to pierce the exterior wall 22 of the aircraft in the proximity of the marking (and thus in the air flow) for the electrical powering of the electroluminescent marking 20 and the aerodynamic performance of the aircraft is not disturbed.

According to one variant embodiment, the extension 68 is joined to the network of electrical cables of the electrical power supply system 42 by using a conductor fluid, optionally covered by a protective resin.

According to another variant embodiment, the extension 68 is joined to the network of electrical cables of the electrical power supply system 42 by using a connector of crimp type, whose male part is connected to the network of electrical cables and a female part is connected to the extension 68.

Figure 7:
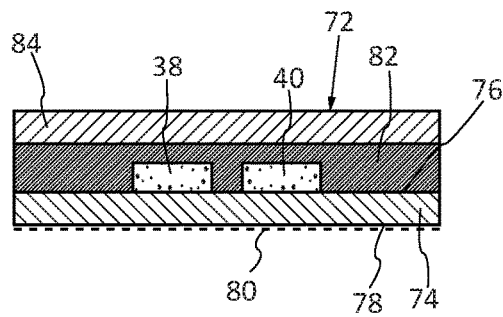
FIG. 7 is a cross-section of the connection tape visible in FIG. 5 prior to its affixing to a panel.

Advantageously, the second face 78 is adhesive. Preferably, prior to its affixing to the exterior wall 22, the connection tape 72 comprises a protection film 80, as illustrated in FIG. 7, configured to cover the second adhesive face 78 and to be removed in order to apply the second face 78 against the exterior wall 22 of the aircraft.

According to one embodiment visible in FIG. 5, the connection tape 72 comprises a decoration layer 82 covered by at least one transparent protection layer 84.

According to a first variant, the marking tape 44 and the connection tape 72 form one and the same tape. According to this variant visible in FIGS. 2 and 3, the marking device 34 comprises a single marking tape which comprises a body 86 having the electroluminescent marking 20 and an extension 68 with a determined length so that the extension 68 extends on the exterior face 26E of the panel 26 from the marking tape 44 to the edge 28 of the panel, and on the interior face 261 of the panel 26 from the edge 28 onward.

According to another variant, the marking device 34 comprises at least one marking tape 44 and at least one connection tape 72 disposed to ensure electrical continuity between the different conductor elements of the tapes 44 and 72. These different tapes may be juxtaposed, overlapping, and/or superimposed.

Figure 8:
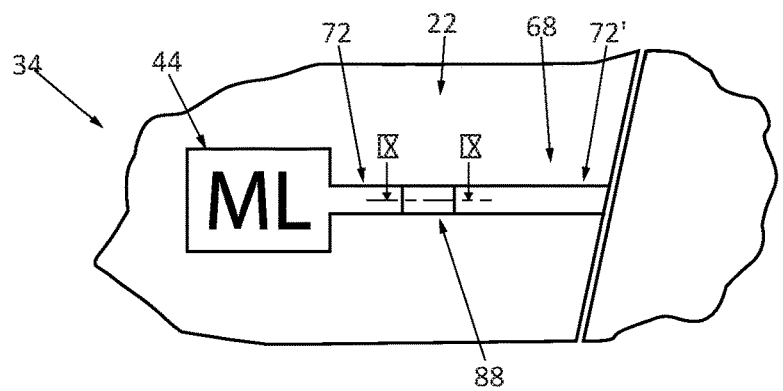
FIG. 8 is a front view of a panel of an aircraft comprising an electroluminescent marking illustrating another embodiment of the disclosure herein.
Figure 9:
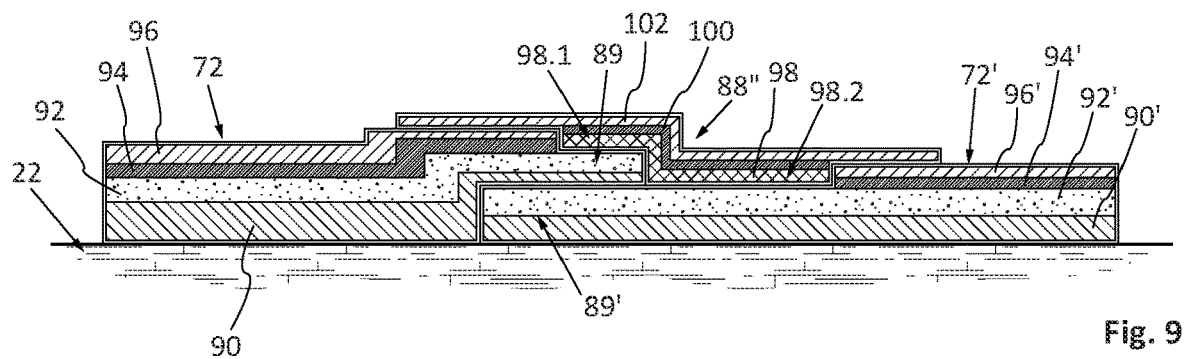
FIG. 9 is a cross-section along line IX-IX of FIG. 8.

According to another variant visible in FIGS. 8 and 9, the extension 68 comprises at least two connection tapes 72, 72' allowing for a joining of the electroluminescent marking 20 to the electrical power supply system 42.

FIG. 9 illustrates one arrangement of three tapes 72, 72', 88 affixed to an exterior wall 22 of the aircraft and disposed to ensure the electrical continuity.

According to one embodiment, a first connection tape 72 comprises, from the exterior wall 22 to the outside, a first flexible backing 90, a conductive layer 92, a decoration layer 94 and a transparent protection layer 96. A second connection tape 72' comprises, from the exterior wall 22 to the outside, a first flexible backing 90', a conductive layer 92', a decoration layer 94' and a transparent protection layer 96'.

The first connection tape 72 comprises a first edge 89 and the second connection tape 72' comprises a second edge 89'.

According to one configuration visible in FIG. 9, the first edge 89 of the first connection tape 72 covers the second edge 89' of the second connection tape 72'.

Regardless of the configuration, the first and second edges 89 and 89' are close together.

To ensure the electrical continuity, the conductive layer 92 of the first connection tape 72 is not covered by the decoration layer 94 and the transparent protection layer 96 in the area of the first edge 89. Likewise, the conductive layer 92' of the second connection tape 72' is not covered by the decoration layer 94' and the transparent protection layer 96' in the area of the second edge 89'.

The third so-called junction tape 88 is configured to ensure the electrical continuity between the first and second connection tapes 72 and 72'. This junction tape 88 is disposed straddling the first and second connection tapes 72 and 72' and it comprises a conductive layer 98 whose first edge 98.1 is configured to come into contact with the conductive layer 92 of the first connection tape 72 and whose second edge 98.2 is configured to come into contact with the conductive layer 92' of the second connection tape 72'.

Preferably, the thickness of the conductive layer 98 of the junction tape 88 (distance separating the first edge 98.1 from the second edge 98.2) is less than or equal to the distance separating the decoration layer 94 and the transparent protection layer 96 of the first connection tape 72 and the decoration layer 94' and the transparent protection layer 96' of the second connection tape 72'.

The junction tape 88 comprises a decoration layer 100 which covers the conductive layer 98 having a width ensuring the continuity between the decoration layer 94 of the first connection tape 72 and the decoration layer 94' of the second connection tape 72'.

The junction tape 88 comprises a transparent protection layer 102 which covers the decoration layer 100. Preferably, the transparent protection layer 102 extends beyond the decoration layer 100 on either side of the decoration layer 100 in order to cover the transparent protection layer 96 of the first connection tape 72 and the transparent protection layer 96' of the second connection tape 72'.

More generally, when the marking device 34 comprises first and second connection tapes 72, 72' each of them comprising at least one electrical conductor 92, 92', it likewise comprises a junction tape 88 straddling the first and second connection tapes 72, 72' so as to join the conductor elements of the first and second connection tapes 72, 72'.

Advantageously, each layer as described above is present in the form of a liquid fluid able to be applied by a classical paint application technique, such as spray or brush application.

While at least one exemplary embodiment of the invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A method for making an electroluminescent marking on an exterior wall of an aircraft, the exterior wall comprising a panel with an exterior face and an interior face and being bounded by an edge, the method comprising:
   forming a marking tape to produce the electroluminescent marking, wherein forming the marking tape comprises:
      attaching a first conductive layer over a flexible backing, which is distinct from the aircraft;
      attaching a dielectric layer over the first conductive layer;
      attaching an electroluminescent layer over the dielectric layer;
      attaching a second conductive layer to the electroluminescent layer;
      arranging at least one power supply electrode on a perimeter of the electroluminescent layer, between the electroluminescent layer and the second conductive layer; and
   affixing the marking tape to the exterior wall of the aircraft; and
   affixing at least one connection tape to the exterior face of the panel as far as the edge of the panel to connect the electroluminescent marking to an electrical control and power supply system positioned inside the aircraft;
   wherein the edge of the panel is disposed downstream from the electroluminescent marking in a direction of flow of an air flow flowing out of the aircraft when the aircraft is in flight.

2. The method as claimed in claim 1, wherein the connection tape extends on the exterior face of the panel from the marking tape to the edge of the panel and on the interior face of the panel from the edge to a point which is offset relative to the edge.

3. The method as claimed in claim 2, wherein the marking tape comprises a second adhesive face configured to be pasted against the exterior wall and the method comprises depositing a protection film against the second adhesive face and removing the protection film prior to the affixing.

4. The method as claimed in claim 1, wherein the marking tape comprises a second adhesive face configured to be pasted against the exterior wall and the method comprises depositing a protection film against the second adhesive face and removing the protection film prior to the affixing.

5. The method as claimed in claim 1, wherein forming the marking tape comprises arranging at least one decoration layer over the second conductive layer positioned about a position vertically over the perimeter of the electroluminescent layer to camouflage the at least one power supply electrode.

6. The method as claimed in claim 5, wherein forming the marking tape comprises arranging at least one protection layer over the decoration layer and the second conductive layer.

7. The method as claimed in claim 1, wherein the at least one connection tape comprises:
   a flexible backing;
   a first electrical conductor affixed to a first surface of the flexible backing;
   a second electrical conductor affixed to the first surface of the flexible backing, wherein the second electrical conductor is spaced apart from the first electrical conductor; and
   a decoration layer covering the first electrical conductor, the second electrical conductor, and the first surface flexible backing.

8. The method as claimed in claim 7, wherein the at least one connection tape comprises at least one transparent protection layer arranged over the decoration layer.

9. The method as claimed in claim 7, wherein the marking tape and the at least one connection tape form one and a same tape.

10. The method as claimed in claim 9, wherein:
    the marking tape comprises a body having the electroluminescent marking; and
    the at least one connection tape is in a form of an extension that extends on the exterior face of the panel away from the body to the edge of the panel and on the interior face of inside of the aircraft.

11. The method as claimed in claim 1, wherein the marking tape and the at least one connection tape form one and a same tape.

12. The method as claimed in claim 11, wherein:
    the marking tape comprises a body having the electroluminescent marking; and
    the at least one connection tape is in a form of an extension that extends on the exterior face of the panel away from the body to the edge of the panel and on the interior face of inside of the aircraft.

13. The method as claimed in claim 1, wherein the at least one connection tape of the extension comprises at least a first connection tape, a second connection tape, and a junction tape, the method comprising:
    arranging the first connection tape, relative to the second connection tape, so that a first edge of the first connection tape covers a second edge of the second connection tape; and arranging the junction tape to straddle the first and second connection tapes so that conductor elements of the first and second connection tapes are electrically connected.

14. The method as claimed in claim 13, wherein:

the first and second connection tapes each comprise:
- a flexible backing;
- a conductive layer arranged to cover the flexible backing;
- a decoration layer arranged to cover the conductive layer; and
- a transparent protection layer arranged to cover the decoration layer;

the junction tape comprises:
- a conductive layer;
- a decoration layer arranged to cover the conductive layer; and
- a transparent protection layer arranged to cover the decoration layer;

the conductive layer of the first connection tape is not covered by either of the decoration layer and the transparent protective layer at the first edge;

the conductive layer of the second connection tape is not covered by either of the decoration layer and the transparent protective layer at the second edge; and the junction tape is arranged, relative to the first and second connection tapes, such that a first edge of the conductive layer of the junction tape contacts the conductive layer of the first connection tape and a second edge of the conductive layer of the junction tape contacts the conductive layer of the second connection tape.

15. The method as claimed in claim 14, wherein the transparent protection layer of the junction tape extends beyond the decoration layer of the junction tape in a direction of the first edge of the junction tape and also in a direction of the second edge of the junction tape, so that the transparent protection layer of the junction tape covers the transparent protection layer of the first connection tape and the transparent protection layer of the second connection tape.

* * * * *